United States Patent

Alavi et al.

[11] Patent Number: 5,844,300
[45] Date of Patent: Dec. 1, 1998

[54] SINGLE POLY DEVICES FOR MONITORING THE LEVEL AND POLARITY OF PROCESS INDUCED CHARGING IN A MOS PROCESS

[75] Inventors: Mohsen Alavi, Beaverton; Payman Aminzadeh, Portland; Robert A. Gasser, Tigard; Sunit Tyagi, Portland; Gilroy J. Vandentop, Aloha, all of Oreg.

[73] Assignee: Intel Corporation, Santa Clara, Calif.

[21] Appl. No.: 716,843

[22] Filed: Sep. 19, 1996

[51] Int. Cl.[6] ........................ H01L 27/082; H01L 27/102; H01L 29/70; H01L 31/11

[52] U.S. Cl. .......................... 257/532; 257/522; 257/296

[58] Field of Search ..................... 257/296, 532, 257/528, 531, 428

[56] References Cited

U.S. PATENT DOCUMENTS

| | | |
|---|---|---|
| 3,660,819 | 5/1972 | Frohman-Bentchkowsky . |
| 5,239,197 | 8/1993 | Yamamota ........................... 257/296 |
| 5,281,842 | 1/1994 | Yasuda et al. ......................... 257/296 |
| 5,293,055 | 3/1994 | Hara et al. ............................ 257/296 |
| 5,301,150 | 4/1994 | Sullivan et al. . |
| 5,315,145 | 5/1994 | Lukaszek . |
| 5,373,476 | 12/1994 | Jeon ..................................... 257/296 |
| 5,519,243 | 5/1996 | Kikuda et al. ........................ 257/296 |
| 5,576,565 | 11/1996 | Yamaguchi et al. .................. 257/296 |

OTHER PUBLICATIONS

"Single Poly EPROM Structure for use in Standard CMOS Processes" by Ohsaki, Asamoto, and Takagaki, *Journal of Solid–State Circuits*, vol. 29, Mar. 3, 1994, beginning at p. 311.

*Primary Examiner*—Stephen Meier
*Attorney, Agent, or Firm*—Blakely, Sokoloff, Taylor & Zafman LLP

[57] ABSTRACT

A monitoring device to monitor process induced charge employing a single layer of polysilicon forming a floating gate. The device comprises two capacitors, one for charging and the other for discharging a floating gate of an n-channel transistor. Embodiments which permit the monitoring of positive charge, negative charge and both positive and negative charge are described. The device is reusable and lends itself to in-line monitoring as opposed to some prior art devices used for end-of-line monitoring.

6 Claims, 6 Drawing Sheets

5,844,300

SINGLE POLY DEVICES FOR MONITORING THE LEVEL AND POLARITY OF PROCESS INDUCED CHARGING IN A MOS PROCESS

BACKGROUND OF THE INVENTION

1. Field of the Invention

The invention relates to structures for monitoring electrostatic charge build-up on wafers during the fabrication of integrated circuits particularly with MOS processing.

2. Prior art

During the fabrication of a MOS integrated circuit, numerous steps are used which can electrically charge a wafer such as plasma etching, sputtering, ion implantation, etc. This charging degrades the gate oxide and can cause defects in the integrated circuit and consequently, it is useful to know the amount and polarity of charge induced by each of the processing steps used in the fabrication of the integrated circuit in order to optimize process conditions.

Test structures shown in FIG. 1 which will be subsequently discussed are sometimes used to monitor process induced charge. The structures are generally fabricated simultaneously with the formation of integrated circuits on a wafer. After processing, the structures are examined to determine the amount of charge induced during the fabrication of the integrated circuits. The charge collecting antennae of the structures are often fabricated from different levels of metal enabling charge to be collected at different processing steps. The structures of FIG. 1 provide end-of-line characterization, that is they are examined after the integrated circuits have been completely fabricated on the wafer.

Another type of charge monitoring device is described in U.S. Pat. No. 5,315,145. The EEPROM-like structure described in this patent is first formed on test wafers prior to the processing which is to be monitored. These devices, however, are erasable and lend themselves to in-line testing, that is testing during processing. Thus for example, the charge resulting from a particular plasma etching step may be determined from the test wafer without need for processing to the end of the line. One problem with these monitoring devices is that they are fabricated using two layers of polysilicon. In most modern logic processes only a single layer of polysilicon is used and consequently these monitoring devices will often require special processing.

Single polysilicon EEPROM devices are known and have been used as memory devices. Early among these devices is the p-channel device described in U.S. Pat. No. 3,660,819. Another device is described in U.S. Pat. No. 5,301,150. Single poly cell structures are also described in "Single Poly EPROM Structure for use in Standard CMOS Processes" by Ohsaki, Asamoto, and Takagaki, *Journal of Solid-State Circuits,* Vol. 29, Mar. 3, 1994, beginning at page 311.

SUMMARY OF THE INVENTION

A device formed in a wafer for providing data on the electrostatic charge build-up that the wafer is subjected to during processing is described. A transistor having an electrically floating gate, and a source region and drain region of a first conductivity type is used to obtain data on the amount of process induced charge that occurred during processing. A capacitor-like structure having at least one doped region of the opposite conductivity type to the first conductivity type is also used. The gate of the transistor extends to the doped region. An antenna for collecting charge is coupled to the doped region.

As will be seen there are several embodiments described, one for collecting positive charge, one for collecting negative charge and one for collecting both positive or negative charge.

DETAILED DESCRIPTION OF THE PRESENT INVENTION

A charge monitoring device for monitoring induced charge during the fabrication of CMOS devices is described. The device is fabricated from a single layer of polysilicon and consequently, may be fabricated using many well-known processes used in the fabrication of logic integrated circuits. In the following description some specific details are set forth such as specific conductivity types. It will be apparent to one skilled in the art that the present invention may be practiced without these specific details. In other instances, well-known fabrication techniques such as those used to fabricate single layer polysilicon memory devices are not described in detail in order not to unnecessarily obscure the present invention.

Figure 1:
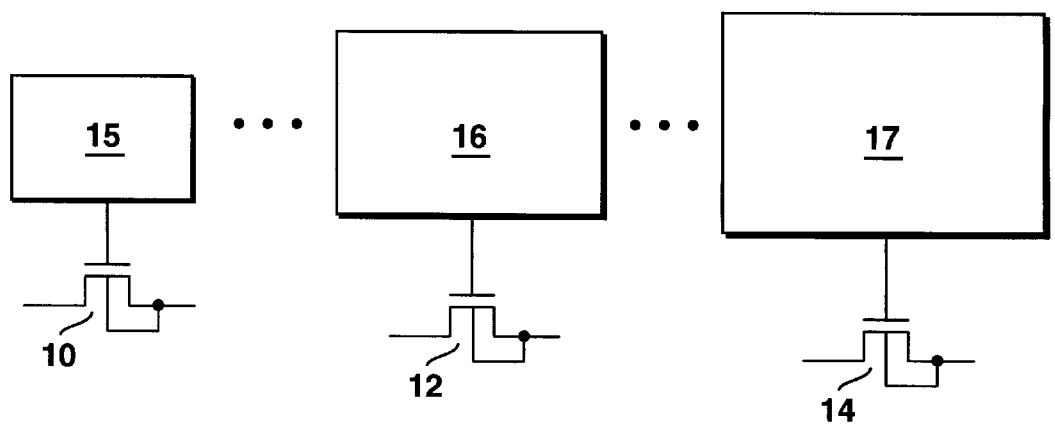
FIG. 1 illustrates a prior art structures used for monitoring process induced charge.

Prior Art Charge Monitoring Structures of FIG. 1

In FIG. 1 three field-effect transistors 10, 12 and 14 are shown each having a gate which is coupled to a plate or antenna shown as antennae 15, 16 and 17, respectively. As illustrated each of the antennae are of different size. Typically the transistors are fabricated in an ordinary manner using for example, polysilicon gates and then the antennae are fabricated from different metal layers. A plurality of devices with different size antennae are fabricated for each metal layer. The antennae collect charge and, depending upon the amount of charge collected, the oxide layer between the gate and channel will be damaged or otherwise affected. By subsequently measuring the breakdown characteristics of the gate oxide and/or measuring the threshold characteristics of the transistor, data is obtained that can be used to determine the amount of electrical charge that the wafer was subjected to at different steps during processing.

Since the amount of charge can vary greatly, different size antennae are generally used on each wafer for each step that is to be monitored. The different size antennae permit monitoring over a wide range. For instance, the antenna 15 may not have received sufficient charge to cause a change in transistor 10 and antenna 17 may have received so much charge that the characteristics of transistor 14 do not yield usable data. Transistor 12 with its antenna 16 being smaller than antenna 12 but larger than antenna 15 may yield useful data. See "A New Gate Oxide Lifetime Prediction Method Using Cumulative Damage Law and its Application to Plasma-Damaged Oxides", by Eriguchi, Uraoka and Odanaka, *IEDM Tech. Digest,* 1995, pp. 323–326 and "Role of Temperature in Process-induced Charging Damage in Sub-Mircon CMOS Transistors", by Brozek, Chan, and Viswanathan, *IEDM Tech. Digest,* 1995, pp. 311–314.

Generally, the structures of FIG. 1 are formed on a wafer (e.g., 600 or so on the wafer) simultaneously with the fabrication of integrated circuits on the wafer. As mentioned, different metal layers are used for the antennae. Such that each structure is tuned to the effects of charging from the layer which corresponds to its antenna. Generally at the end of processing the structures of FIG. 1 are probe tested and the amount of charge is then determined. Note these structures are not reusable since the charge permanently alters the characteristics of the transistors 10, 12 and 14 and the testing which characterizes gate oxide quality is destructive.

Single Poly EEPROM Device (SPEED) of the Prior Art

Figure 2:
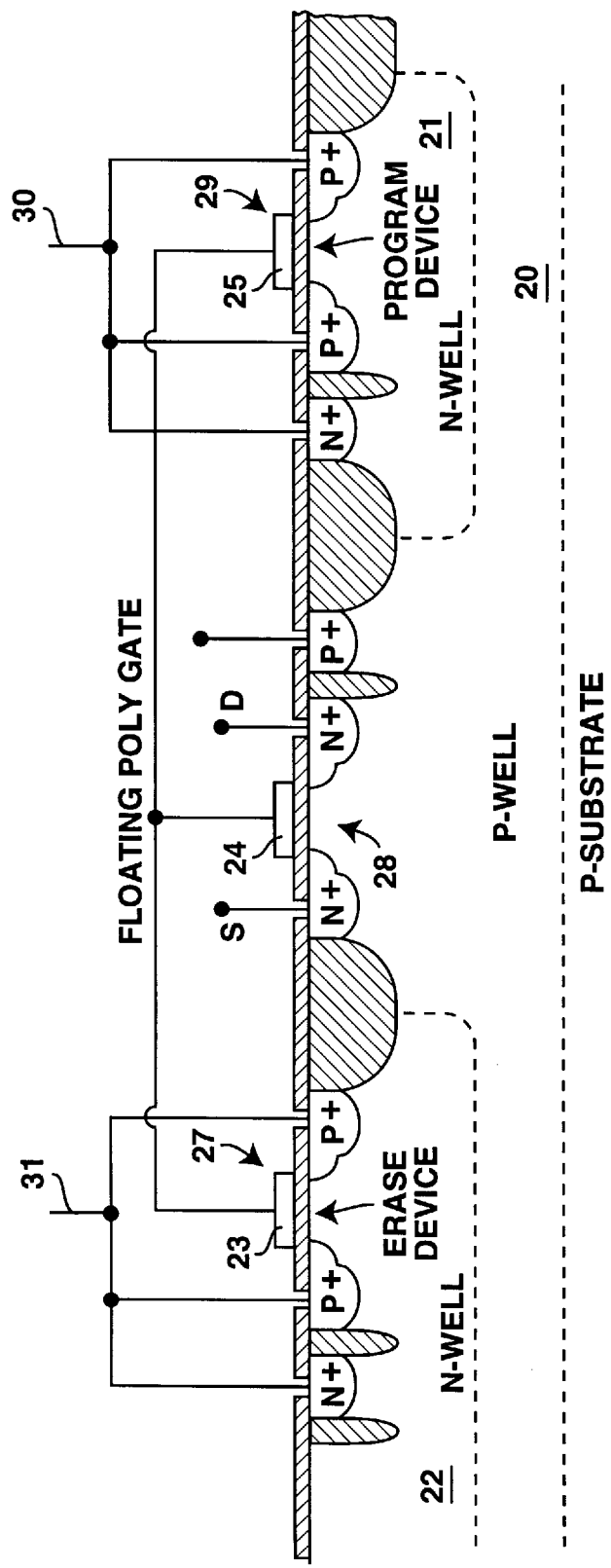
FIG. 2 is a cross sectional elevation view of a wafer showing a prior art memory device formed from a single layer of polysilicon.

In FIG. 2 a memory device used to store information on an integrated circuit such as a microprocessor is shown. Generally an array of these devices is fabricated on a substrate which includes a microprocessor or other integrated circuit. The SPEEDs may store, for example, manufacturing information (e.g., data of manufacture, lot number, part number, etc.) which information is written into the memory and generally remains thereon for the life of the product. Unlike other floating gate memory devices often used in Flash and EEPROM memories, this device is fabricated using a single layer of polycrystalline silicon (polysilicon). Many processes used for fabricating fast microprocessors use only a single layer of polysilicon and thus the device of FIG. 1 can be fabricated with the same process use for fabrication of the microprocessor without any additional processing.

The device of FIG. 2 is fabricated on a p-type substrate. It includes an n-channel field-effect transistor 28 formed in a p-well 20 having a source and drain region and a polysilicon gate 24. The polysilicon gate 24 extends over the n-well 21 forming the gate extension 25; gate 24 also extends over the n-well 22 forming the gate extension 23. The gate 23 and extensions 24 and 25 (sometimes hereinafter collectively referred to as floating gate) are a continuous single polysilicon element fabricated from the single layer of polysilicon. It is completely surrounded by insulation, that is it is electrically floating.

The gate extension 25 is disposed between and overlap a pair of p-type regions forming a capacitor-like structure 29. Both of these p-type regions are connected to a line 30. Line 30 is also coupled to the well 21. Similarly, the gate extension 23 is disposed between and overlap a pair of p-type regions in the well 22 forming a capacitor-like structure 28 with the extension 23. These two p-type regions are connected to the line 31 and to the well 22. The capacitor structure 29 which is about 10 times larger than structure 27 is referred to as a program device since it is used in programming that is, to place (negative) charge on the floating gate. The capacitor structure 27 is referred to as the erase device since it is used to remove charge (or positively charge) the floating gate. Programming increases the threshold voltage of transistor 28 (harder to turn on) while erasing lowers the value of threshold voltage.

To program the device of FIG. 2, that is to negatively charge the floating gate, line 30 is held high while the source region of transistor 28 and line 31 are held low. A positive potential (lower than the potential applied to line 30) is applied to the drain region. Hot electron injection occurs from the channel of the transistor 28 onto the floating gate. To erase the gate, line 31 is held high while the drain and source region of transistor 28 and line 30 are held low. Erasing then occurs by the tunneling of charge from the floating gate into the n-well 22. As mentioned, the capacitor structure 29 is approximately 10 times the size of the structure 27. Also transistor 28 is about the size of structure 27. Thus, the positive potential on line 30 used for programming is substantially present over the channel of transistor 28. By the same token, the positive potential on line 31 for erasing is substantially present over the smaller capacitor structure 27 inducing the tunneling.

Accidental Discovery Leading to the Present Invention

The device of FIG. 2 was used as part of a test chip. Normally the lines 30 and 31 are not directly accessible but rather the memory devices are included in an array and these lines are accessed through buffers, decoders, or the like. In the test vehicle, however, the lines 30 and 31 were directly connected to pads so they could be probed. It was noticed that the devices of FIG. 2 had a high initial threshold voltage (that is the cells were programmed), and moreover, that this threshold varied from wafer-to-wafer. Later when the structure of FIG. 2 was placed in an array, the devices were unprogrammed after fabrication.

It was subsequently concluded that the pads acted as charge collecting antennae causing the threshold voltage shift in the devices. This was confirmed by observing the effect of plasma steps known to induce charging and led to the present invention and in particular, to the realization that the device of FIG. 2, modified with antennae and other modifications could be used to monitor charge.

Charge Monitoring Device of the Present Invention

Figure 3:
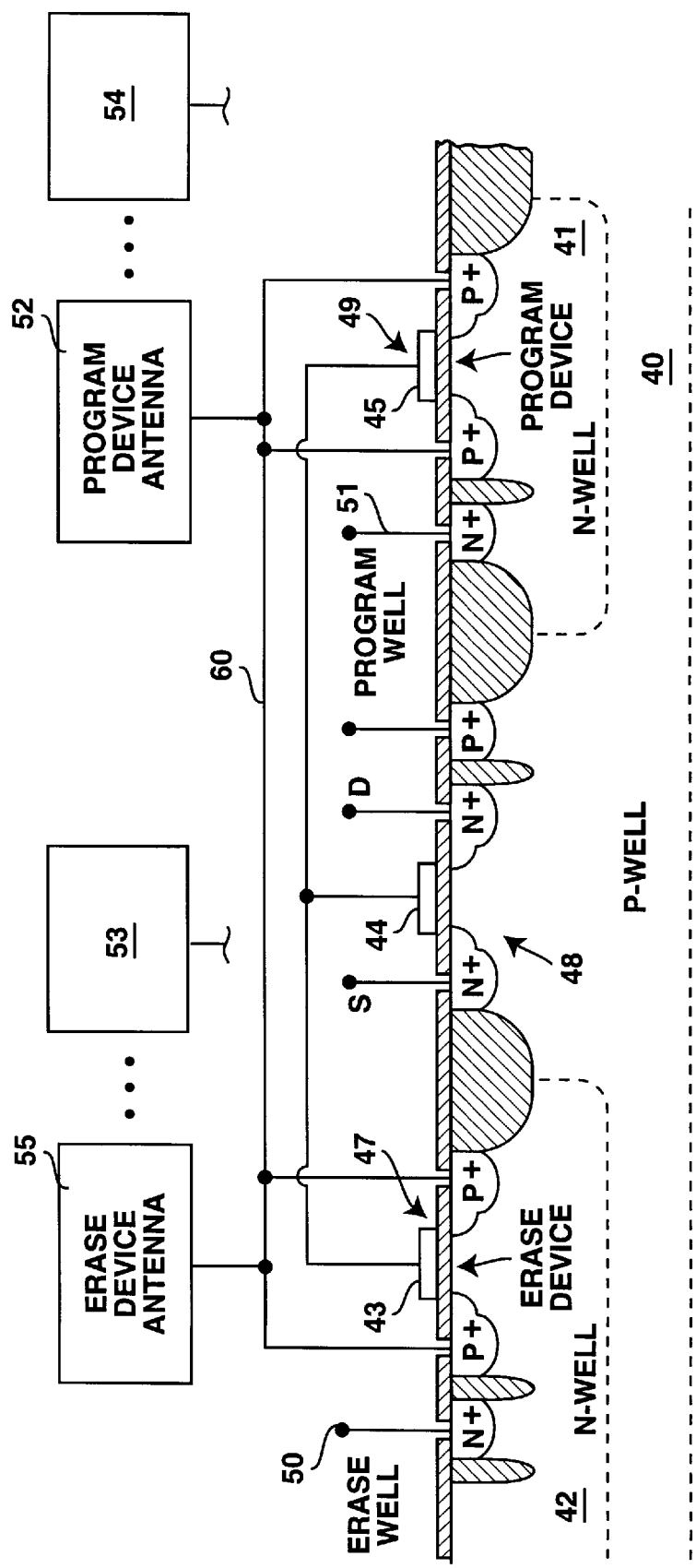
FIG. 3 illustrates the device of FIG. 2 modified for use as a charge monitoring device of the present invention in an embodiment where both positive and negative charge on the antennae program/erase the floating gate.

Referring now to FIG. 3 the monitoring device of the present invention uses the SPEED device of FIG. 2 with modifications as will be described. Again as shown in FIG. 3, the device includes an n-channel transistor 48 formed in a p-well 40. Two spaced-apart n-wells are used, wells 41 and 42. The well 41 includes a capacitor-like structure 49 formed from a p-channel transistor. Similarly, a capacitor-like structure 47 (erase device) is formed from a p-channel transistor located in well 42. For the embodiment of FIG. 3 the wells 41 and 42 are floating, that is, there is no connection to lines 50 and 55. Both the capacitor-like structures 47 and 49 rely on the overlap between the p regions and the overlying gate extensions 43 and 45, respectively. Again the gate extensions 43 and 45 are continuous with the gate 44 formed over the n-channel transistor 48. Moreover, the entire floating gate is surrounded with oxide and consequently is electrically floating. As was the case with the SPEED device of FIG. 2 the capacitor structure 49 is substantially larger (e.g., 10x) than the structure 47 and the n-channel transistor 48.

Charge collecting plates or antennae are connected to at least one of the program or erase capacitor structures or, as shown in FIG. 3, to both capacitor structures. (The antenna connected to the program capacitor structure is much more effective in influencing the device during charging due to the large size of the program capacitor). Antenna 55 is coupled to the p regions associated with the capacitor-like structure 47, and similarly the antenna 52 is connected to the p regions associated with the capacitor-like structure 49. These antennae may be made from metal used in any of the interconnect layers. In the case of end-of-line characterization, monitoring devices are formed with metal from each of the metal layers to enable measuring of charge from different steps in the processing. However, if pre-fabricated wafers are used as in-line monitors, the antennae are to be made using the top-most layer of metal which would get exposed to the plasma during characterization. As was the case with the structure shown in FIG. 1, different size antennae are used for each metal layer coupled to a plurality of the devices shown in FIG. 3. Two such antennae 53 and 54 are shown in FIG. 3. This permits the monitoring of a wide range of charge as described in conjunction with FIG. 1. Additionally, a metal cover may be formed over the floating gate such as shown by metal cover 60 of FIG. 3. This cover for example, may be fabricated from the first metal layer following the fabrication of the floating gate. The metal cover 60 is used to protect the floating gate from ultraviolet radiation. Such radiation could have the effect of discharging the charge stored on the floating gate, thus eradicate charge that has occurred as a result of processing. This would alter the data used to determine the amount of the process induced charge and may result in erroneous results. Alternatively, where it is necessary to measure ultraviolet radiation, the metal cover 60 may be left off floating gate. In this instance, the floating gate may be charged (i.e., electrons placed on the floating gate through the capacitor structure 49) prior to exposure to ultraviolet radiation. Then the charge remaining on the floating gate is determined by measuring the threshold voltage of the transistor 48 and from this the amount of ultraviolet radiation that the floating gate was subjected to is found. Along these lines it is possible to precharge the floating gate either positively or negatively prior to subjecting the monitoring device of FIG. 3 to process induce charge in order to enable the floating gate to receive a greater amount of charge during processing without saturating the characteristics of the device of FIG. 3. This is also the case for the monitoring devices of FIGS. 4 and 5 as well.

When the antennae of the device of FIG. 3 are subjected to positive charge, the floating gate will be pulled positive primarily because of the capacitive coupling through capacitor structure 39. This will result in the tunneling of charge from the channel region of the n-channel transistor 48 into the floating gate. Note that this is a somewhat different charging mechanism than occurs in the device of FIG. 2 since there is no current between the source and drain regions at this time. On the other hand, if the antennae of the device of FIG. 3 are subjected to a sufficient amount of negative charge, tunneling will occur primarily through the capacitor structure 47 causing the floating gate to be charged positively. In this regard, note that wells 41 and 42 are both floating and thus the floating gate can be charged either positively or negatively by the antennae.

In practice, the device of FIG. 3 may be fabricated simultaneously with the fabrication with other integrated circuits on a wafer. Since the device of FIG. 3 employs only a single layer of polysilicon it may be fabricated with any one of a plurality of well-known single poly processes. The antennae may be fabricated as mentioned from any of the metal layers. Once the antennae are fabricating and the device is subjected to charge, the amount of charge may be measured by measuring the characteristics of the transistor 48, that is for example, measuring the threshold voltage of the transistor 48 by applying a potential across the source and drain regions. Once this measurement is made the device may be erased and reused. Note that either positive or negative charge may be removed from the floating gate by appropriately applying potentials to the p regions associated with either the capacitor-like structure 47 or 49. Additionally, in cases where the floating gate is not covered by a metal layer free electrons from the floating gate may be removed by subjecting the wafer to ultraviolet radiation.

The device of FIG. 3 stores charge as mentioned on the floating gate. There is a second mechanism, however, that in some instances causes charge states in the gate oxide. This will also cause, for instance, a shift in the threshold voltage of transistor 48. This second mechanism also acts to record the amount of process induced charge. This charge may be removed by a bake step at a moderate temperature (about 400° C.) to eliminate the fixed oxide charge.

Figure 4:
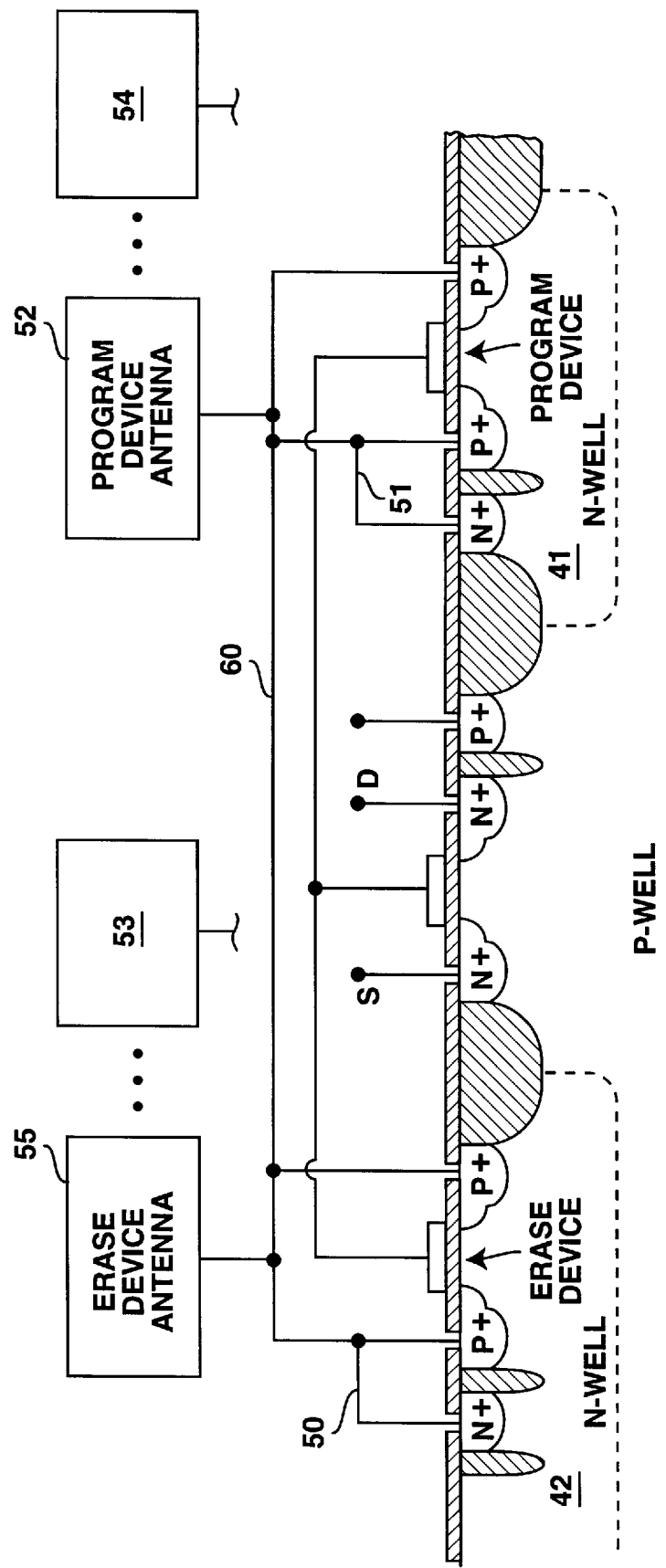
FIG. 4 is an alternate embodiment for the device of FIG. 3 for monitoring positive charge on the antennae.

An alternate embodiment is shown in FIG. 4 which may be identical to the embodiment of FIG. 3 except that the n-well 42 is coupled to the p regions in that well by line 50, and similarly, the n-well 41 is coupled to the p regions in well 41 by line 51. This causes the wells to be biased by the charge on the antennae. If the antennae 55 or 52 receive negative charge, this charge will simply discharge to the substrate through the forward biased n-well to substrate junctions 41 and 42. Thus, the floating gate for the embodiment of FIG. 4 will only become negatively charged when the antennae are subject to positive charge. Therefore the embodiment of FIG. 4 is used to measure positive charge. In other respects the embodiment of FIG. 4 is fabricated and operates as described in conjunction with FIG. 3.

Figure 5:
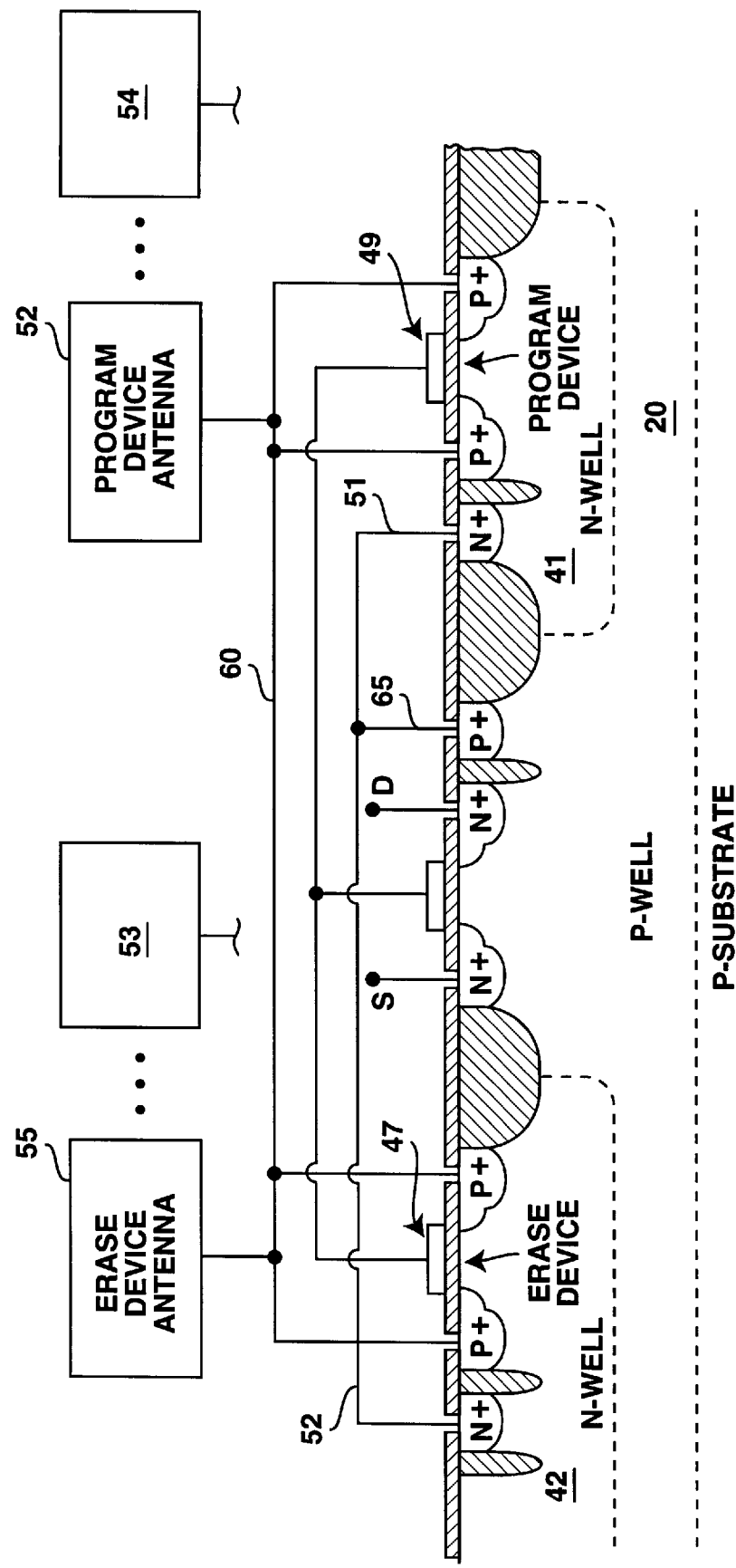
FIG. 5 illustrates an alternate embodiment to the device of FIG. 3 for monitoring negative charge on the antennae.

For the embodiment of FIG. 5 the n-wells 41 and 42 are coupled to the p-well 20, that is lines 51, 52 and 65 are all connected. This causes the p-well 20 and the n-wells 41 and 42 to be maintained at the same potential. In this embodiment, when positive charge accumulates on the antennae it will simply discharge to the substrate through the forward biased p+ to n-well junctions associated with the capacitor structures 47 and 49. Thus, the embodiment of FIG. 5 is used to monitor negative charge on the antennae. This monitoring device otherwise is fabricated and operates as described for the embodiment of FIG. 3.

Circuit for Permitting Probing for the Device of the Present Invention

Figure 6:
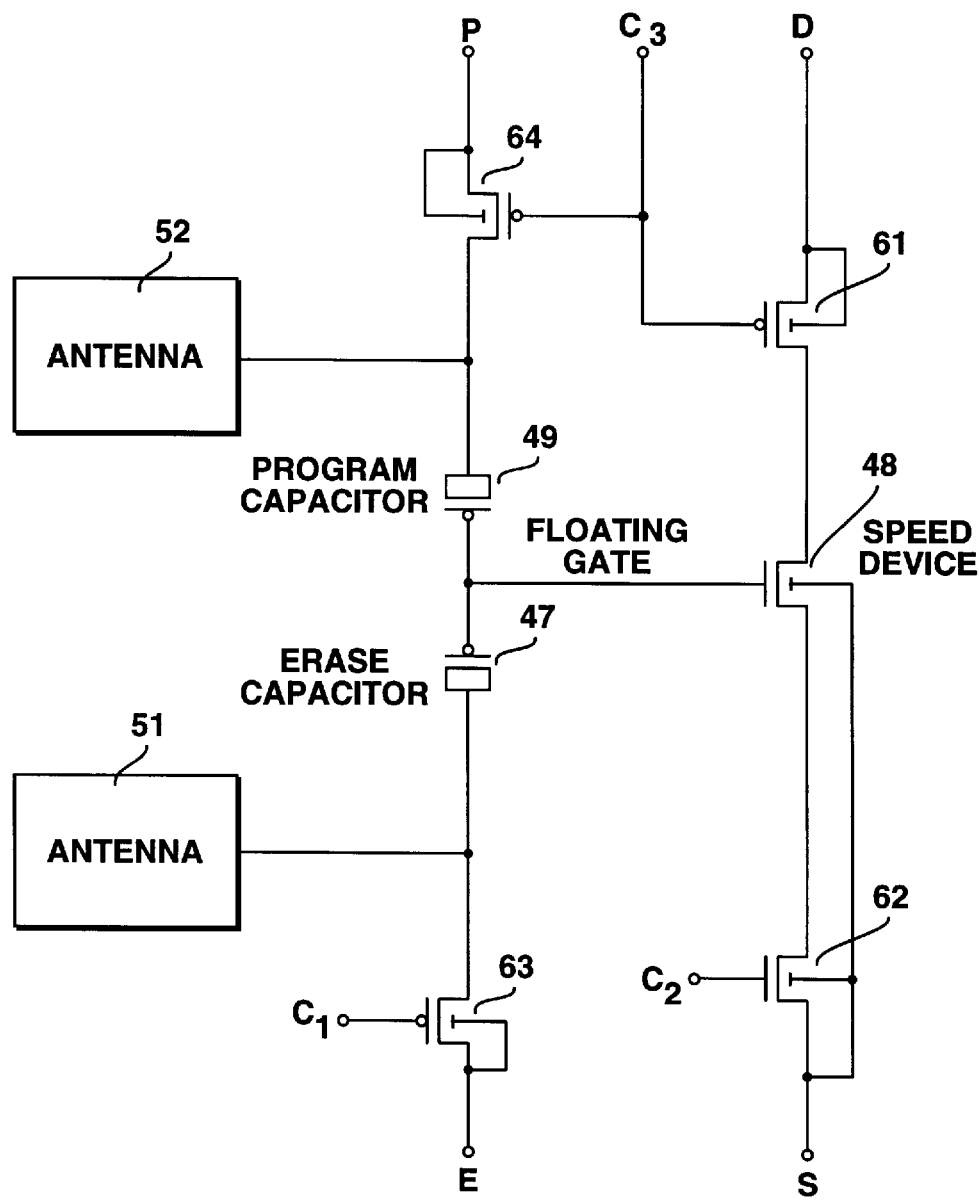
FIG. 6 illustrates the invented monitoring device in a circuit suitable for probing without introducing undesirable charge through the probing pads.

Referring to FIG. 6 the monitor device is again shown in schematic form as the erase capacitor 47, n-channel transistor 48, program capacitor 49, floating gate, and the antennae 55 and 52. The antenna 55 is connected to a probe pad "E" through the p-channel transistor 63. Similarly, the capacitor 49 is coupled to a pad "P" through the p-channel 64. The source of transistor 48 is coupled to a pad "S" through n-channel transistor 62 and finally, the drain of the transistor 48 is coupled to pad "D" through p-channel transistor 61. By application of control signals C1, C2 and C3 access is obtained through the pass gates allowing access to the terminals of the monitoring device. The transistors 61 through 64 are used to prevent the introduction of undesirable charge onto the monitoring device that might otherwise occur since probe pads act as additional antennae. Transistors 61 and 64 may be controlled using separate control inputs if the user wishes to apply different voltages to these control inputs.

Thus, a monitoring device which permit in-line monitoring of process induced charge has been described. The device is particularly useful since it is fabricated using only a single layer of polysilicon, thereby making it compatible with CMOS logic processors.

We claim:

1. A device formed in a wafer for providing data on electrostatic charge build-up that the wafer is subjected to, comprising:

a transistor of a first conductivity type having an electrically floating gate;

a first and second electrically floating well of a first conductivity type formed in the wafer;

a first capacitor structure defined by at least one region of a second conductivity type formed in the first well and the gate of the first transistor extending over the first well;

a second capacitor structure defined by at least one second region of a second conductivity type formed in the second well and the gate extending over the second well; and at least one antenna for collecting charge coupled to the first and second regions.

2. The device defined by claim 1 wherein the first capacitor structure is formed by a pair of second conductivity type first regions in the first well and wherein the second capacitor structure is formed by a pair of second conductivity type second regions in the second well.

3. A device formed in a wafer for providing data on electrostatic charge build-up that the wafer is subjected to, comprising:

a transistor of a first conductivity type having an electrically floating gate;

a first and second well of a first conductivity type formed in the wafer;

a first capacitor structure defined by at least one first region of a second conductivity type formed in the first well and the gate of the first transistor extending over the first well, the first region being electrically coupled to the first well;

a second capacitor structure defined by at least one second region of a second conductivity type formed in the second well and the gate extending over the second well, the second region being electrically coupled to the second well; and at least one antenna for collecting charge coupled to the first and second regions.

4. The device defined by claim 3 wherein the first capacitor structure is formed by a pair of second conductivity type first regions in the first well and wherein the second capacitor structure is formed by a pair of second conductivity type second regions in the second well.

5. A device formed in a wafer for providing data on electrostatic charge build-up that the wafer is subjected to, comprising:

a transistor of a first conductivity type having an electrically floating gate formed in a substrate region;

a first and second well of a first conductivity type formed in the wafer, the first and second wells being electrically connected to one another and the substrate region;

a first capacitor structure defined by at least one first region of a second conductivity type formed in the first well and the gate of the first transistor extending over the first well;

a second capacitor structure defined by at least one second region of a second conductivity type formed in the second well and the gate extending over the second well; and at least one antenna for collecting charge coupled to the first and second regions.

6. The device defined by claim 5 wherein the first capacitor structure is formed by a pair of second conductivity type first regions in the first well and wherein the second capacitor structure is formed by a pair of second conductivity type second regions in the second well.

* * * * *